United States Patent
Kofuji et al.

(10) Patent No.: US 6,784,109 B2
(45) Date of Patent: Aug. 31, 2004

(54) METHOD FOR FABRICATING SEMICONDUCTOR DEVICES INCLUDING WIRING FORMING WITH A POROUS LOW-K FILM AND COPPER

(75) Inventors: Naoyuki Kofuji, Tama (JP); Masaru Izawa, Hino (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/920,834

(22) Filed: Aug. 3, 2001

(65) Prior Publication Data

US 2003/0008509 A1 Jan. 9, 2003

(30) Foreign Application Priority Data

Jul. 6, 2001 (JP) ........................................ 2001-206229

(51) Int. Cl.[7] .......................................... H01L 21/302
(52) U.S. Cl. ..................... 438/706; 438/710; 438/723
(58) Field of Search ................................ 438/706, 710, 438/712, 714, 723, 724, 906, 963; 134/1.2, 1

(56) References Cited

U.S. PATENT DOCUMENTS

| | | | | |
|---|---|---|---|---|
| 5,741,396 A | * | 4/1998 | Loewenstein | 438/724 |
| 6,071,809 A | * | 6/2000 | Zhao | 438/634 |
| 6,156,651 A | * | 12/2000 | Havemann | 438/674 |
| 6,232,237 B1 | | 5/2001 | Tamaoka et al. | |
| 6,358,842 B1 | * | 3/2002 | Zhou et al. | 438/633 |
| 6,376,366 B1 | * | 4/2002 | Lin et al. | 438/637 |
| 6,387,824 B1 | * | 5/2002 | Aoi | 438/778 |
| 6,457,477 B1 | * | 10/2002 | Young et al. | 134/1.2 |

FOREIGN PATENT DOCUMENTS

JP 11-176814 7/1999

OTHER PUBLICATIONS

Gijutsu Joho Kyokai Shuppan, Dec. 27, 2000, "New Material and Process Technique of the Next Generation of ULSI Interconnect", pp. 295–305.
Technical Report of IEICE: "Technique for Forming Cu Dual Damascene Interconnect Using Low Dielectric Constant Films", S. Giho, Aug., 2000, pp. 87–92.

* cited by examiner

Primary Examiner—Kin-Chan Chen
(74) Attorney, Agent, or Firm—Mattingly, Stanger & Malur, P.C.

(57) ABSTRACT

Semiconductor devices having a wiring construction consisting of a conductive layer (a copper layer) and an insulating layer (a porous insulator layer with low dielectric constant) are fabricated. A method for forming wiring of semiconductor devices includes a first step for forming a first insulating material layer on a sample; a second step for forming a second insulating material layer with a dielectric constant less than 2.5; a third step for patterning the second insulating material layer by a plasma etching method; a fourth step for depositing a metal film on the second insulating material layer by a sputtering method; a fifth step for forming a copper layer on the metal film; and a sixth step for removing an unnecessary portion of the copper layer by Chemical Mechanical Polishing, wherein all the processes from the third to the fourth step are performed under process conditions.

11 Claims, 4 Drawing Sheets

METHOD FOR FABRICATING SEMICONDUCTOR DEVICES INCLUDING WIRING FORMING WITH A POROUS LOW-K FILM AND COPPER

BACKGROUND OF THE INVENTION

1. Field of the Invention

The present invention relates to a method and apparatus for fabricating semiconductor devices, and more particularly relates to a wiring forming method of semiconductor devices using porous material with low dielectric constant as intermetallic dielectric and using copper as conductor material.

2. Description of the Related Prior Arts

With respect to a wiring forming method of semiconductor devices using material with low dielectric constant, "Shingaku Giho; TECHNICAL REPORT OF IEICE, ED2000-136, SDM2000-118, ICD2000-72(2000-08), pp. 87–92" (reference 1) discloses the title "Technique for forming Cu dual damascene interconnects using low dielectric constant films". Further, as a cleaning technique, "Gijutsu Joho Kyokai Shuppan (issued on Dec. 27, 2000) pp. 295–305" (reference 2) discloses the title "New material and process technique of the next generation of ULSI Interconnect". Furthermore, as a resist ashing technique, there is a technique disclosed in "Japanese Published Unexamined Patent Application No. Hei 11-176818 (corresponding to U.S. Pat. No. 6,232,237) (references 3 and 4).

SUMMARY OF THE INVENTION

The present inventors have studied the following technique as a wiring forming method of semiconductor devices using material with low dielectric constant (hereinafter, called low—k dielectric) and copper. The method will be explained in accordance with the process diagram of FIG. 2.

First, in (step 1), a dielectric barrier film (e.g., an SiN film) 4 is deposited by CVD on a sample (an initial structure) having a copper layer 3 buried into the stacked-structure of a low-k film 1 and a silicon oxide (TEOS) layer 2. In (step 2), a low-k film 5 is coated thereon. In (step 3), a mask material layer 6 (e.g., TEOS) is deposited thereon. In (step 4), a material of the same kind of the dielectric barrier film 4 is deposited thereon as a mask material layer 7. In (step 5), a photoresist 8 is coated thereon to pattern a hole structure in the photoresist 8. In (step 6), the mask material layer 7 is dry-etched with the photoresist 8 as a mask to form a hole structure in the mask material layer 7. In (step 7), the photoresist 8 is removed. In (step 8), a new photoresist 9 is coated to pattern a trench structure in the photoresist 9. In (step 9), the mask material layer 6 is dry-etched with the mask material layer 7 as a mask to form a hole structure in the mask material layer 6, thereby providing a hard-mask made of the mask material layer 6.

In (step 10), the mask material layer 7 is etched with the photoresist 9 as a mask to form a trench structure in the mask material layer 7, thereby providing a hard-mask made of the mask material layer 7. In (step 11), the low-k film 5 is subject to anisotropic dry etching with the mask material layer 6 as a mask to form a hole structure (a via hole) 10. In (step 12), the mask material layer 6 is dry-etched in a trench form with the mask material layer 7 as a mask. In this process, the photoresist 9 is removed at the same time.

In (step 13), the low-k film 5 is subject to anisotropic dry etching with the mask material layers 7 and 6 as a mask to form a trench-structure recess 11. In (step 14), the dielectric barrier film 4 is removed by dry etching with the hole structure (the via hole) 10 formed in the low-k film 5 as a mask opening to form a hole structure. At the same time, the mask material layer 7 of the same material of the dielectric barrier film 4 is removed by dry etching. In (step 15), to remove a polymer containing copper 12 deposited on the inner wall surface of the via hole 10 in the previous process, a fluorocarbon film 13 deposited on the inner wall surface of the trench-structure recess 11, and a copper degraded layer 14 formed on the surface of the copper layer 3, wet cleaning is performed using chemicals containing amine. In (step 16), a Ta—TaN stacked film 15 is deposited by a sputtering method. In (step 17), a copper layer 16 is deposited by the sputtering method.

In (step 18), a copper film 17 is electrochemical deposited on the copper layer 16 deposited by sputtering in the previous process. In (step 19), excess portions of the copper layer 16, the copper film 17, and the Ta—TaN stacked film 15 is removed by the CMP method (Chemical Mechanical Polishing). Finally, in (step 20), the wet cleaning is performed to obtain a wiring completion sample of the first layer. The processes 1 to 20 are performed repeatedly to form interconnect.

In a high speed device, it is essential to use an insulating film with very low dielectric constant less than 2.5. Such an insulating film is entirely porous, that is, a low-k film like a sponge. The insulating film easily trap chemicals by the wet cleaning process and cannot be easily dried. The chemicals trapping of the porous low-k film is the principal problem.

The wiring method illustrated in FIG. 2 using the porous low-k film has the wet cleaning process such as steps 15 and 20. The porous low-k film traps chemicals in the wet cleaning process, so that moisture remains in the film. For example, when the above-mentioned method in reference 3 is used to omit two wet cleaning processes, the fluorocarbon film 13 can be removed by an $H_2O$ plasma processing. However, since the polymer containing copper 12 cannot be removed, the polymer containing copper 12 remains and diffuses in the porous low-k film to deteriorate the electric property of the porous low-k film. In the method of reference 3, as compared with the process of FIG. 2, since adhesion of the TEOS layer 2 to the dielectric barrier film 4 is poor, the layers are easily removed by thermal treatment.

As described above, due to chemicals trapping property, remaining of the polymer containing copper or the copper degraded layer, and low adhesion, wiring forming of the porous low-k film and copper is very difficult currently.

Accordingly, to solve the foregoing problems, an object of the present invention is to provide a method and apparatus capable of forming good wiring of a porous low-k film and copper.

The present inventors have found that the wet cleaning of the previous process 15 has, in addition to three effects of (1) removal of the fluorocarbon film 13, (2) removal of the polymer containing copper 12, and (3) removal of the copper degraded layer 14, a fourth effect, (4) removal of fluorine included into the TEOS film in the etching process 14 by pure water cleaning in the wet cleaning process.

The above-mentioned method of reference 3 has no wet cleaning processes including the pure water cleaning at all, fluorine included into the TEOS film 6 in the etching process 14 remains. The present inventors have studied and found that the remaining fluorine lowers the adhesion of the dielectric barrier film 4 deposited on the TEOS film 6 in the second layer wiring forming process.

In other words, the present invention provides "A method for fabricating semiconductor devices comprising at least: a first step for forming a first insulating material layer (a dielectric barrier film) on a sample; a second step for forming on the first insulating material layer a second insulating material layer (a porous low-k film) with a dielectric constant less than 2.5; a third step for patterning the second insulating material layer by a plasma etching method; a fourth step for depositing a metal film on the second insulating material layer by a sputtering method; a fifth step for forming a copper layer on the metal film; and a sixth step for removing an unnecessary portion of the copper layer by Chemical Mechanical Polishing, wherein all the processes from the third to the fourth step are performed under drying process conditions, and a pure water treatment for cleaning the sample with pure water is provided after the sixth step".

All the processes from the third step for patterning the second insulating material layer by a plasma etching method to the fourth step for depositing a metal film on the second insulating material layer by a sputtering method are performed under dry process conditions. It is thus possible to prevent the second insulating material layer with low dielectric constant from trapping chemicals, and to avoid the above-mentioned problem of the deteriorated wiring property. The treatment for cleaning the sample with pure water is newly provided. It is also possible to eliminate the above-mentioned problem of the deteriorated adhesion due to the remaining fluorine into the TEOS film 6, thereby forming good wiring.

It is desirable not to expose the sample to the atmosphere during all the periods from the start of the third step for patterning the second insulating material layer by a plasma etching method to the end of the fourth step for depositing a metal film on the second insulating material layer by a sputtering method. It is possible to thoroughly prevent the second insulating material layer with low dielectric constant from trapping chemicals, thereby effectively avoiding the above-mentioned problem of the deteriorated wiring property.

After the third step and before the fourth step, it is desirable to include an etching process for removing the first insulating material layer (the dielectric barrier film) by etching by means of plasma of a mixed gas containing $HF_3$ and Ar through an opening patterned in the second insulating material layer in the third step. The mixed gas plasma containing $HF_3$ and Ar is used to reduce a bias electric power applied to the sample. The copper as the substrate can be prevented from being etched. The polymer containing copper will not be deposited. The effect of the $HF_3$ gas can remove the fluorocarbon film.

In the process for plasma etching the first insulating material layer (the dielectric barrier film), the bias electric power per unit sample area applied to the sample is desirably below 0.16 W/cm$^2$. It is thus possible to effectively prevent the copper as the substrate from being etched.

The processing pressure in the process for plasma etching the first insulating material layer (the dielectric barrier film) is desirably set to below 0.5 Pa. It is thus possible to prevent SiF or CF generated by etching of the dielectric barrier film (SiC film) from being deposited again on the sample as a foreign matter.

Immediately after the process for plasma etching the first insulating material layer (the dielectric barrier film), it is desirable to provide a process for subjecting to the sample an $O_2$ or $H_2$ plasma processing. In the plasma etching process immediately before the $O_2$ or $H_2$ plasma processing, the bottom surface of the processing hole (the via hole), that is, the fluorinated surface of the copper layer as the substrate can be recovered to a clean surface.

The present invention provides "A plasma etching processing apparatus comprising: a sample table for placing a sample provided in a reduced pressure processing chamber; gas introduction means for introducing a processing gas into the reduced pressure processing chamber; exhaust means for exhausting the processing gas out of the reduced pressure processing chamber; and means for generating plasma of the introduced processing gas in the reduced pressure processing chamber, further comprising: magnetic field apply means for applying a magnetic field to the sample provided on the back surface of the sample; and voltage apply means for ON-OFF applying to the sample a negative DC voltage in which the OFF period of the ON-OFF application is below $10^{-6}$ seconds".

The mutual effect of an electric field perpendicular to the sample surface formed by means of a negative DC voltage ON-OFF applied to the sample by the voltage apply means and a magnetic field formed in parallel with the sample surface by means of the magnetic field apply means can efficiently generate plasma of the etching gas introduced from the gas introduction mechanism. The negative voltage applied to the sample accelerates positive ions in the generated plasma which are then radiated into the sample surface to promote the etching reaction of the sample. Electrons are radiated into the sample surface during the apply OFF period of the apply negative voltage to prevent charging-up of the positive electric charge to the sample by the positive ion radiation. The charging-up prevention mechanism permits good etching of the insulating material such as the TEOS, SiN, SiC, or low-k film. Since a positive voltage is not applied to the sample, the positive ions are not accelerated and radiated into the inner wall surface of the processing chamber. Few foreign matters or metal contaminants are caused by cutting away the inner wall material of the processing chamber. The apply OFF period $\Delta t$ of the apply negative voltage is set to below $10^{-6}$ seconds which is sufficiently short. During the short apply OFF period $\Delta t$, the positive ions cannot reach the inner wall surface of the processing chamber. The inner wall material of the processing chamber will not cut away by ion bombardment.

The present invention provides a dry etching method comprising using the plasma etching processing apparatus to etch an insulating film deposited on a copper layer provided on a sample under the conditions of the negative DC voltage of below 200V. In this manner, the negative DC voltage applied to the sample is set to below 200V to etch the insulating film deposited on the copper layer. The copper layer 3 as the substrate will not be etched at all. The polymer containing copper will not deposited on the inner wall surface of the processing hole or processing trench.

The present invention provides "An apparatus for fabricating semiconductor devices comprising a sputtering processing chamber for depositing a metal film on a semiconductor sample by a sputtering method; and an etching processing chamber for etching an insulating film on the semiconductor sample by a dry etching method, further comprising: a plasma processing chamber for performing a plasma processing of the semiconductor device; and exhaust gas processing equipment capable of subjecting both combustible gas and combustion buck up gas to an exhaust gas process. In this manner, the exhaust gas processing equipment capable of subjecting both combustible gas and combustion buck up gas to an exhaust gas process is added to subject the semiconductor sample to a desired process using both combustible gas such as $H_2$ and combustion buck up gas such as $NF_3$ or $O_2$ and to subject both combustible gas and combustion buck up gas exhausted from the processing chamber to an exhaust gas process. Here, the combustion buck up gas is a gas supporting or promoting the combustion of the combustible gas.

The apparatus for fabricating semiconductor devices is desirably provided with gas introduction means for introducing at least three gases of $NF_3$, $H_2$, and $O_2$ into the processing chamber. The three-gas introduction means is provided to remove the fluorocarbon film by $NF_3$ gas plasma. The oxidation effect by $O_2$ gas plasma and the reduction effect by $H_2$ gas are used to recover the contaminated (fluorinated) copper layer surface to a clean surface.

FIG. 1 shows a basic process diagram of a method for fabricating semiconductor devices according to the present invention. A new process of the present invention is largely different in the following points from the process shown in FIG. 2.

(1) First, in step 14 of FIG. 1, a mixed gas of $NF_3$ and Ar is used to etch the dielectric barrier film 4. In this case, the bias electric power per unit area applied to the sample is below 0.16 W/cm². Under the conditions, since the copper layer 3 is not etched at all, the polymer containing copper is not deposited on the inner wall surface of the via hole 10. The effect of the $NF_3$ gas can effectively remove the fluorocarbon film on the inner wall surface of the trench 11 or the via hole 10 from the step 9 to 13.

In the process described above, the fluorocarbon film or the polymer containing copper will not deposited on the inner wall surface of the hole or trench. Since the degraded layer of the copper layer 3 surface is removed, the wet cleaning process after etching is unnecessary. Wet cleaning is not performed in step 16, and the process for depositing the next Ta—TaN stacked film 15 can be done immediately. The problem of chemicals trapping of the wet cleaning will not be caused.

Unlike the above-mentioned method of reference 3, a wet cleaning process 21 is provided after a CMP process 20. In the wet cleaning after the CMP process, since the low-k film is not contacted directly with chemicals, the problem of chemicals trapping will not be caused. The remaining fluorine in the TEOS film 6 as the mask material layer can be removed by the pure water treatment in the wet cleaning process.

Other object, construction, and effect of the present invention will be naturally apparent in the detailed description with the following embodiments.

DESCRIPTION OF THE PREFERRED EMBODIMENTS

The present invention will be described in detail hereinbelow by the embodiments with reference to the drawings.
(Embodiment 1)

Figure 1:
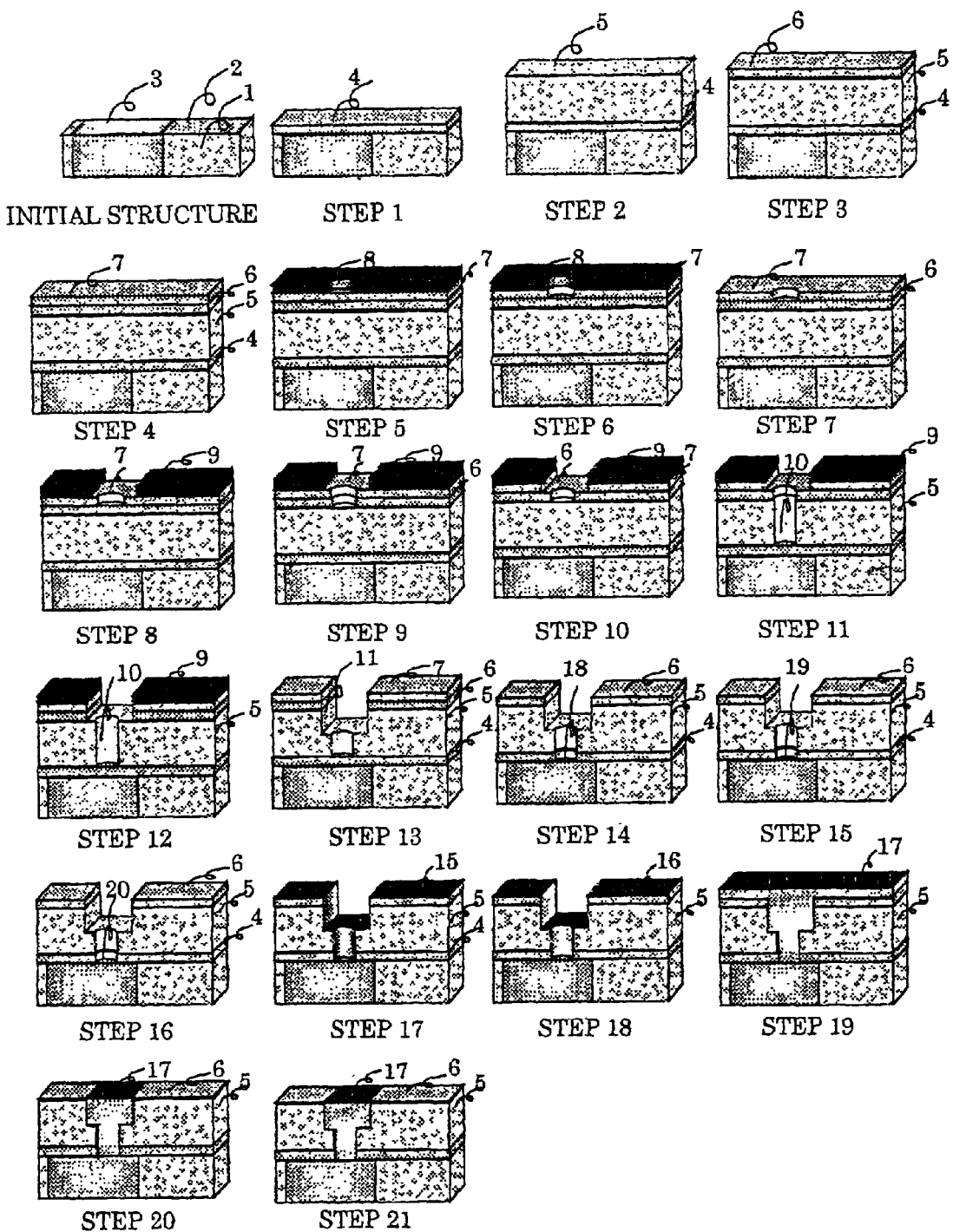
FIG. 1 is a process diagram showing a wiring forming method of a semiconductor device according to the present invention.
Figure 2:
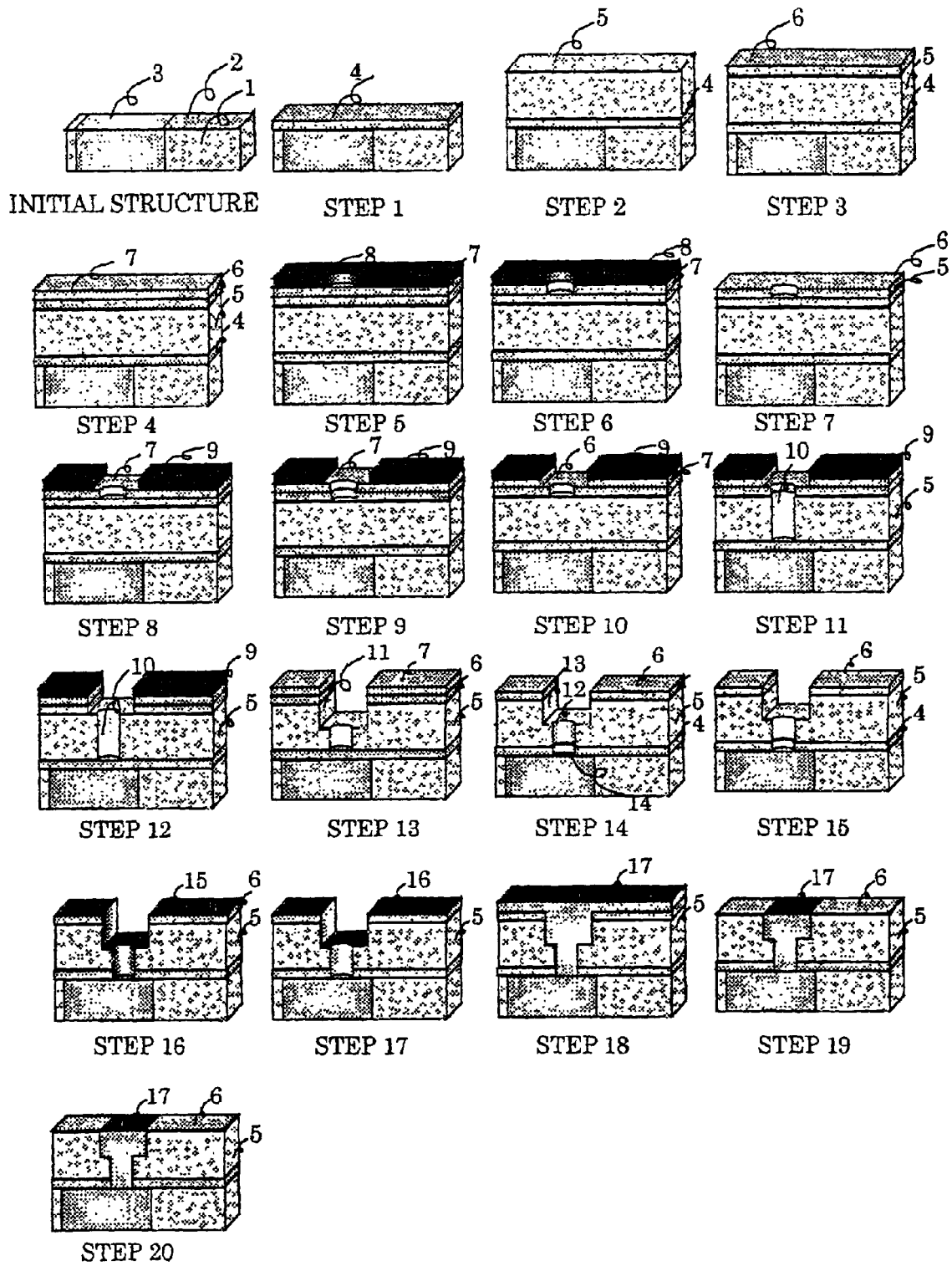
FIG. 2 is a process diagram showing one example of a wiring forming method studied by the inventor.

FIG. 1 shows a series of processes of a method for forming wiring having a porous low-k film (an insulating film) and a copper layer (a conductor layer) of one embodiment of the present invention. In this embodiment, a wiring having a porous low-k film and a copper layer is formed according to this process.

First, a sample (initial structure) having a copper wiring layer 3 buried in the stacked-structure of a porous low-k dielectric 1 and a TEOS film 2. In (step 1), an SiN film as a dielectric barrier film 4 is deposited thereon by a CVD method. Thereafter, in (step 2), a porous low-k film 5 made of organic material is coated thereon. In (step 3), a TEOS film as a mask material layer 6 is deposited thereon by the CVD method. In (step 4), an SiN film as a mask material layer 7 is deposited thereon by the CVD method. In (step 5), a photoresist 8 is patterned. In (step 6), with the photoresist 8 as a mask by plasma of a mixed gas of $CHF_3$, Ar and $O_2$, the SiN film as the mask material layer 7 is dry-etched to pattern a hole structure in the mask material layer 7.

In (step 7), the photoresist 8 is removed. In (step 8), a new photoresist 9 is patterned. In (step 9), with the mask material layer 7 as a mask by plasma of the mixed gas of $C_5F_8$, Ar and $O_2$, the TEOS film as the mask material layer 6 is dry-etched to pattern a hole structure in the mask material layer 6. In (step 10), with the photoresist 9 as a mask by plasma of the mixed gas of $CHF_3$, Ar and $O_2$, the SiN film as the mask material layer 7 is dry-etched to form an SiN film mask having a trench structure. In (step 11), plasma of $NH_3$ gas is used to subject the porous low-k film 5 to anisotropic dry etching through the hole structure of the mask material layer 6, thereby forming a via hole 10. In (step 12), with the mask material layer 7 having a trench structure as a mask by plasma of the mixed gas of $C_5F_8$, Ar and $O_2$, the TEOS film as the mask material layer 6 is dry-etched to form a trench structure in the mask material layer 6. In this process, the photoresist 9 is also removed by etching at the same time.

In (step 13), plasma of $NH_3$ gas is used to subject the porous low-k film 5 to anisotropic dry etching through the trench structure of the mask material layers 6 and 7 to form a trench-structure recess 11. In (step 14), plasma of a mixed gas of $NF_3$ and Ar is used to form a hole structure in the SiN film as the dielectric barrier film 4, and to remove the SiN film as the mask material layer 7 by dry etching. Here, since, in (step 14), the plasma of the mixed gas of $NF_3$ and Ar is used, the fluorocarbon film will not be deposited on the trench side surface. Since the plasma of the mixed gas of $NF_3$ and Ar is used, the bias electric power to be applied to the sample (wafer) can be reduced. In the prior art process using $CHF_3$ gas, the apply bias electric power per unit sample area must be higher than 0.64 W/cm². On the contrary, the process using a mixed gas of $NF_3$ and Ar according to the present invention permits etching with an apply bias electric power which is below 0.16 W/cm² which is a quarter of that of the prior art. When the apply bias electric power is reduced to below 0.16 W/cm² in this process, the copper layer 3 is hardly etched. Thus, the polymer containing copper will not be deposited on the inner wall surface of the via hole 10. For this reason, the wet cleaning process for removing the fluorocarbon film or the polymer containing copper is unnecessary.

On the other hand, the surface of the copper layer 3 is fluorinated by the process with plasma containing $NF_3$ gas of the step 14. To remove the fluorinated copper layer 18, in (step 15), the fluorinated copper layer 18 is oxidized by an $O_2$ plasma processing to be substituted by a copper oxide layer 19. In (step 16), the copper oxide layer 19 is reduced and removed by an $H_2$ plasma processing to generate a clean copper layer surface 20. In (step 17), a Ta—TaN stacked film 15 is deposited by a sputtering method. In (step 18), a copper layer 16 is deposited by the sputtering method. In (step 19), a copper film 17 is electrochemical deposited on the copper layer 16 deposited by sputtering. In (step 20), the excess copper layer portions 16 and 17 and the Ta—TaN stacked film portion 15 are removed by a CMP method. After the CMP removing process, in (step 21), remaining fluorine in the TEOS film 6 is removed by wet cleaning including pure water cleaning. The cleaned sample is repeatedly subject to the processes in the order from the CVD deposition process of the SiN film of the step 1 to form interconnect.

When the cleaning process of the step 21 is omitted, fluorine remains in the TEOS film 6 or 2. The adhesion of the dielectric barrier film 4 to the TEOS film 6 or 2 deposited in the next step 1 is poor. In the subsequent thermal treatment or wire bonding, a stress applied to the wafer easily causes removing at the interface of the dielectric barrier film 4 and the TEOS film 2.

In the above-mentioned wiring forming method of the present invention, fluorine in the TEOS film 6 or 2 is removed preferably in the cleaning of the step 21. The adhesion of the dielectric barrier film 4 deposited on the TEOS film 6 or 2 in the next step 1 is very high. Thus, the wiring forming yield can be improved greatly. This method has no process for directly contacting the porous low-k film with the cleaning chemicals. The problem of chemicals trapping of the porous low-k film can be improved significantly.

The wiring of the porous low-k film and the copper layer formed by the wiring method of the present invention has high reliability and high yield as compared with the prior art wiring method. In this embodiment, the SiN film is used as the dielectric barrier film 4 and the mask material layer 7, and the TEOS film is used as the mask material layer 6. Other material may be used to give the same effect. Further, in this embodiment, the organic film is used as the porous low-k films 1 and 5. In the case of a film having an SiOH group or a film having an SiO group, a gas containing F and a mixed gas containing Ar are used in the dry etching of the previous steps 11 and 13, the same effect can be obtained.

(Embodiment 2)

Figure 4:
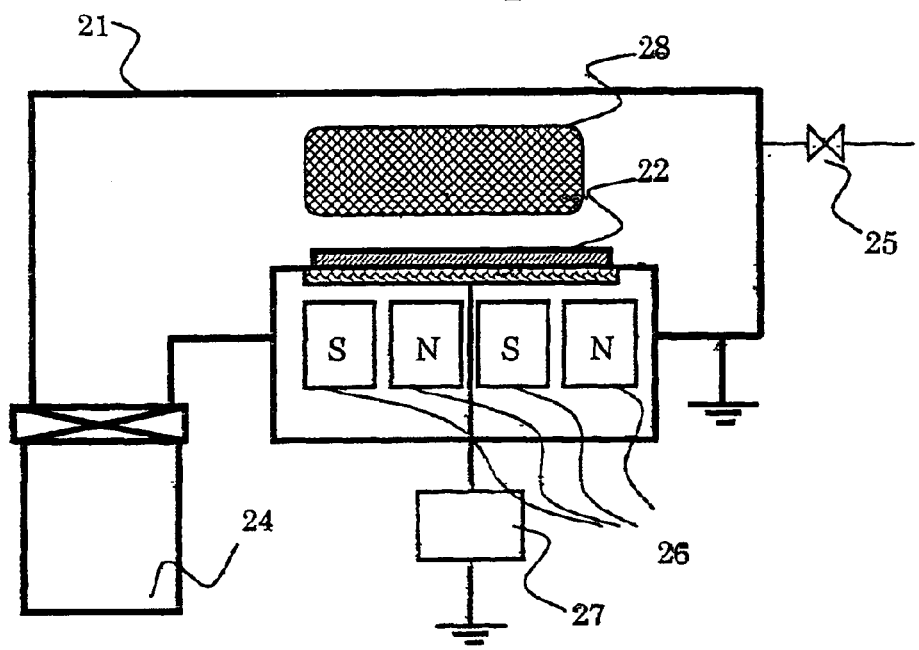
FIG. 4 is a diagram showing the outline construction of a plasma processing apparatus for use in the wiring forming of the semiconductor device according to the present invention.
Figure 5:
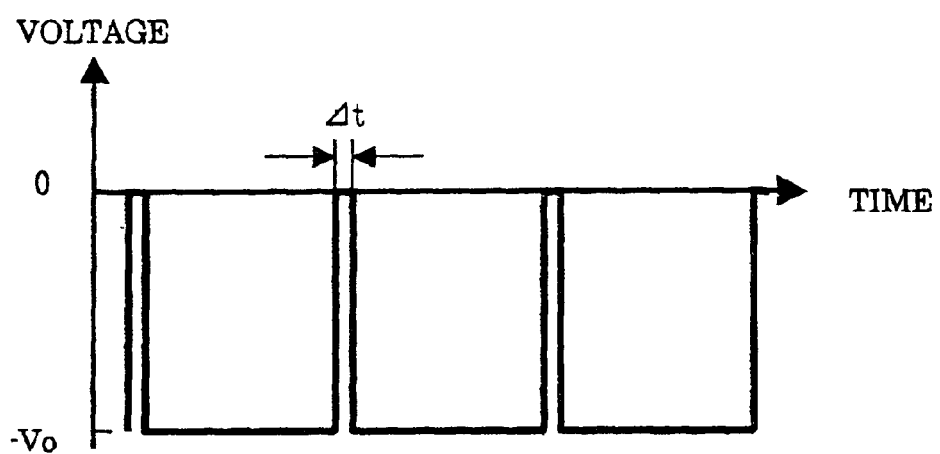
FIG. 5 is a diagram showing change of an apply negative voltage to a sample (wafer) in the plasma processing apparatus shown in FIG. 4 with time.

The steps 14, 15 and 16 of Embodiment 1 require a plasma processing apparatus causing few foreign matters or metal contaminants. The plasma processing apparatus therefor is shown in FIG. 4. This apparatus has a reduced pressure processing chamber 21, a sample table 23 for placing a processed sample 22, an exhaust mechanism 24 for exhaustion in the reduced pressure processing chamber 21, and a mechanism 25 for introducing gas into the reduced pressure processing chamber 21, and further is equipped with magnets 26 provided on the back surface of the sample 22 for generating a magnetic line of force in parallel with the sample surface. This apparatus has a power supply 27 for applying voltage to the sample 22. The power supply 27 intermittently applies a negative DC voltage Vo as shown in FIG. 5 to the sample 22. There is generated plasma 28 of an etching gas introduced from the gas introduction mechanism 25 by the mutual effect of an electric field perpendicular to the sample 22 generated by the apply negative voltage and a magnet field in parallel with the sample surface generated by the magnet 26. The positive ions in the plasma 28 are radiated into the sample 22 by the negative voltage applied to the sample 22 to promote the etching reaction of the sample. During the apply OFF period of the DC voltage, the electrons in the plasma 28 are radiated into the sample 22 to neutralize charging-up of the sample 22 by the previous positive ion radiation. The charging-up neutralizing function permits etching the insulating material such as the TEOS, SiN, SiC, and low-k film. In this apparatus, since there is no timing in which a positive voltage is applied to the sample 22, positive ions will not be accelerated and radiated into the inner wall of the reduced pressure processing chamber. For this reason, few foreign matters or metal contaminants are caused by cutting away the inner wall material of the reduced pressure processing chamber 21. In particular, when the apply OFF period $\Box t$ of the negative DC voltage to the sample 22 is shorter than $10^{-6}$ seconds, the ions cannot reach the inner wall of the processing chamber 21 during the apply OFF period $\Box t$ of the DC voltage. The inner wall material of the processing chamber 21 will not be cut away at all by ion bombardment.

This apparatus is used to execute the step 14 of Embodiment 1. The gas introduction mechanism 25 introduces a mixed gas of $NF_3$ and Ar into the processing chamber 21. The negative DC voltage is intermittently applied (or ON-OFF applied) to the sample 22 to etch the dielectric barrier film (the SiC film) 4. When the pressure in the processing chamber 21 is set to below 0.5 Pa, SiF or CF generated by etching the SiC film is found to be prevented from being deposited on the sample 22 again as foreign matter. When the apply negative voltage Vo of FIG. 5 is set to below 200V, the copper layer 3 as the substrate is not etched at all. It is thus found that the polymer containing copper is not deposited on the inner wall surface of the via hole 10 or the trench-structure recess 11.

(Embodiment 3)

Figure 3:
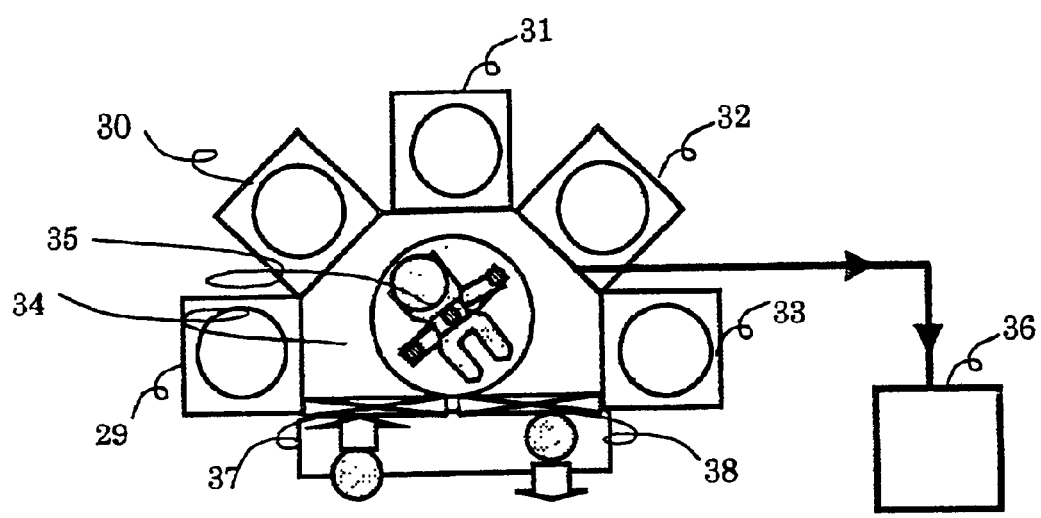
FIG. 3 is a diagram showing the outline construction of the semiconductor fabricating apparatus for use in the wiring forming of the semiconductor device according to the present invention.

In the wiring method shown in Embodiment 1, during the period from the etching process of the mask material layer 6 of the step 9 to the sputtering process of the Ta—TaN stacked film 15 of the step 17, the surface of the porous low-k film 5 is exposed to the inner space of the processing chamber 21. The sample 22 is contacted with the atmosphere during this period, the porous low-k film can trap chemicals due to moisture in the atmosphere. To avoid the problem of the chemicals trapping, there is needed a semiconductor fabricating apparatus capable of continuously performing in the vacuum the drying process from the step 9 to 17. FIG. 3 shows one construction example of the semiconductor processing apparatus capable of continuously performing in the vacuum these steps. This apparatus has a reduced pressure processing chamber 29 capable of etching a mask material layer, a reduced pressure processing chamber 30 capable of etching a porous low-k film, a reduced pressure processing chamber 31 capable of etching a dielectric barrier film using plasma of a mixed gas of $NF_3$ and Ar, a reduced pressure processing chamber 32 capable of performing post-treatment using plasma of the $H_2$ gas and $O_2$ gas, a reduced pressure processing chamber 33 capable of depositing a metal film by a sputtering method, a reduced pressure processing chamber 34 for connecting these processing spaces under reduced pressure, and a carrying robot 35 permitting carrying in the vacuum. This apparatus uses both combustible gas such as $H_2$ and combustion buck up gas such as $NF_3$ or $O_2$. This apparatus has exhaust gas processing equipment 36 capable of exhaust gas processing both combustible gas and combustion buck up gas.

The flow of the wiring forming process in this semiconductor fabricating apparatus will be described below. The sample is carried from a carry-in port 37 into the reduced pressure processing chamber 29 for mask etching so as to be subject to the mask processing of the steps 9 and 10 of Embodiment 1. Thereafter, the sample is carried in the vacuum by the carrying robot 35 into the reduced pressure processing chamber 30 for low-k film etching so as to be subject to the porous low-k film etching of the step 11. Then, the sample is carried again into the reduced pressure processing chamber 29 for mask etching so as to be subject to the mask processing of the step 12. The sample is carried into the reduced pressure processing chamber 30 for low-k film etching so as to be subject to the low-k film etching of the step 13. The sample is carried into the reduced pressure processing chamber 31 for dielectric barrier film etching so as to be subject to the dielectric barrier film etching of the step 14. The sample is carried into the reduced pressure processing chamber 32 for post-treatment so as to be subject to the $O_2$ plasma processing of the step 15 and the $H_2$ plasma processing of the step 16. Finally, the sample is subject to the metal film deposition process of the step 17 in the reduced pressure processing chamber 33 for sputtering so as to be fetched from a carry-out port 38 out of the apparatus (in the atmosphere).

The apparatus construction shown in FIG. 3 can perform all the processes from the step 9 to 17 without exposing the sample to the atmosphere at all. The problem of chemicals trapping of the porous low-k film due to the moisture in the atmosphere can be avoided thoroughly. Wiring forming having higher reliability can be done to improve the yield of fabricating the semiconductor devices. The reduced pressure processing chamber 32 for post-treatment and the reduced pressure processing chamber 31 for dielectric barrier film etching have the same construction as that of the plasma processing chamber of Embodiment 2. Thus, the problem of foreign matters and contaminants can be eliminated so as to fabricate semiconductor devices having very high reliability.

As is apparent from the detailed description, according to the present invention, in wiring forming of a semiconductor device using a material with low dielectric constant such as the porous low-k film as intermetallic dielectric, the material with low dielectric constant can be prevented from trapping chemicals so as to permit wiring forming having high reliability, thereby greatly improving the yield of fabricating the semiconductor device.

What is claimed is:

1. A method for fabricating semiconductor devices comprising at least: a first step for forming a first insulating material layer on a sample; a second step for forming on said first insulating material layer a second insulating material layer including at least a porous low-k film with a dielectric constant less than 2.5; a third step for patterning said second insulating material layer by a plasma etching method; a fourth step for depositing a metal film on said second insulating material layer by a sputtering method; a fifth step for forming a copper layer on said metal film; and a sixth step for removing an unnecessary portion of said copper layer by Chemical Mechanical Polishing, wherein all the processes from said third to said fourth step are performed under dry process conditions in which said sample is not exposed to the atmosphere during all the periods from the start of said third step to the end of said fourth step, said third step for patterning said second insulating material layer includes at least a step for forming a via hole, and a pure water treatment for cleaning said sample with pure water provided after said sixth step.

2. The method for fabricating semiconductor devices according to claim 1, further comprising, after said third step and before said fourth step, an etching process for removing predetermined part of said first insulating material layer by etching by means of plasma of a mixed gas containing at least $NF_3$ through an opening patterned in said second insulating material layer in said third step.

3. The method for fabricating semiconductor devices according to claim 2, wherein said etching process is performed by setting the bias electric power per unit sample area applied to the sample to below 0.16 $W/cm^2$.

4. A The method for fabricating semiconductor devices according to claim 2, wherein said etching process is performed by setting the processing plasma pressure to below 0.5 Pa.

5. The method for fabricating semiconductor devices according to claim 2, further comprising, immediately after said etching process, an oxidizing process for subjecting said sample to an $O_2$ plasma processing and after said oxidizing process, a reducing process for subjecting said sample to a $H_2$ plasma processing, wherein said sample surface is oxidized and then reduced, consequently cleansed.

6. The method for fabricating semiconductor devices according to claim 2, wherein said mixed gas contains $NF_3$ and Ar.

7. The method for fabricating semiconductor devices according to claim 6, further comprising, immediately after said etching process, an oxidizing process for subjecting said sample to an $O_2$ plasma processing and after said oxidizing process, a reducing process for subjecting said sample to a $H_2$ plasma processing, whereby said sample surface is oxidized and then reduced and consequently cleansed.

8. A method for fabricating semiconductor devices comprising at least: a first step for forming a first insulating material layer on a sample; a second step for forming on said first insulating material layer a second insulating material layer including at least a porous low-k film with a dielectric constant less than 2.5; a third step for patterning said second insulating material layer by a plasma etching method; a fourth step for depositing a metal film on said second insulating material layer by a sputtering method; a fifth step for forming a copper layer on said metal film; and a sixth step for removing an unnecessary portion of said copper layer by Chemical Mechanical Polishing, wherein after said third step and before said fourth step, there is an etching process for removing predetermined part of said first insulating material layer by etching by means of plasma of a mixed gas containing at least $NF_3$ through an opening patterned in said second insulating material layer in said third step, all the processes form said third to said fourth step are performed under dry process conditions in which said sample is not exposed to the atmosphere during all the periods from the start of said third step to the end of said fourth step, and a pure water treatment for cleaning said sample with pure water provided after said sixth step.

9. The method for fabricating semiconductor devices according to claim 8, wherein said mixed gas contains $NF_3$ and Ar.

10. The method for fabricating semiconductor devices according to claim 8, wherein said etching process is performed by setting the bias electric power per unit sample area applied to the sample to below 0.16 $W/cm^2$.

11. The method for fabricating semiconductor devices according to claim 8, wherein said etching process is performed by setting the processing plasma pressure to below 0.5 Pa.

* * * * *